United States Patent
Curatola et al.

(10) Patent No.: US 11,289,593 B2
(45) Date of Patent: Mar. 29, 2022

(54) BREAKDOWN RESISTANT HEMT SUBSTRATE AND DEVICE

(71) Applicant: Infineon Technologies Austria AG, Villach (AT)

(72) Inventors: Gilberto Curatola, Villach (AT); Martin Huber, Villach (AT); Ingo Daumiller, Faak (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 1039 days.

(21) Appl. No.: 14/814,956

(22) Filed: Jul. 31, 2015

(65) Prior Publication Data
US 2017/0033210 A1  Feb. 2, 2017

(51) Int. Cl.
*H01L 29/06* (2006.01)
*H01L 29/778* (2006.01)
(Continued)

(52) U.S. Cl.
CPC ...... *H01L 29/7787* (2013.01); *H01L 21/0254* (2013.01); *H01L 21/02381* (2013.01);
(Continued)

(58) Field of Classification Search
CPC ........... H01L 29/7787; H01L 21/02381; H01L 21/02458; H01L 21/0254; H01L 21/26513;
(Continued)

(56) References Cited

U.S. PATENT DOCUMENTS 8,754,442 B2 * 6/2014 Shi .............. H01L 29/7394
257/140
9,559,161 B2 * 1/2017 Curatola .......... H01L 29/0607
(Continued)

FOREIGN PATENT DOCUMENTS

CN          1846310 A     10/2006

OTHER PUBLICATIONS

Umeda, et al., "Blocking-Voltage Boosting Technology for GaN Transistors by Widening Depletion Layer in Si Substrates", 2010 IEEE International Electron Devices Meeting (IEDM), pp. 20.5.1-20.5.4, 2010.

*Primary Examiner* — Ori Nadav
(74) *Attorney, Agent, or Firm* — Murphy, Bilak & Homiller, PLLC

(57) ABSTRACT

A compound semiconductor device structure having a main surface and a rear surface includes a silicon substrate including first and second substrate layers. The first substrate layer extends to the rear surface. The second substrate layer extends to a first side of the substrate that is opposite from the rear surface such that the first substrate layer is completely separated from the first side by the second substrate layer. A nucleation region is formed on the first side of the silicon substrate and includes a nitride layer. A lattice transition layer is formed on the nucleation region and includes a type III-V semiconductor nitride. The lattice transition layer is configured to alleviate stress arising in the silicon substrate due to lattice mismatch between the silicon substrate and other layers in the compound semiconductor device structure. The second substrate layer is configured to suppress an inversion layer in the silicon substrate.

12 Claims, 5 Drawing Sheets

(51) Int. Cl.
*H01L 29/10* (2006.01)
*H01L 21/02* (2006.01)
*H01L 21/265* (2006.01)
*H01L 29/205* (2006.01)
*H01L 29/66* (2006.01)
*H01L 29/20* (2006.01)

(52) U.S. Cl.
CPC .. *H01L 21/02458* (2013.01); *H01L 21/26513* (2013.01); *H01L 29/0619* (2013.01); *H01L 29/0649* (2013.01); *H01L 29/1075* (2013.01); *H01L 29/1083* (2013.01); *H01L 29/205* (2013.01); *H01L 29/66462* (2013.01); *H01L 29/7786* (2013.01); *H01L 29/2003* (2013.01)

(58) Field of Classification Search
CPC ............. H01L 29/0619; H01L 29/0649; H01L 29/1075
USPC ...................................... 257/76–79
See application file for complete search history.

(56) References Cited

U.S. PATENT DOCUMENTS

| | | | |
|---|---|---|---|
| 10,090,406 B2 * | 10/2018 | Prechtl | H01L 29/66462 |
| 2002/0185655 A1 * | 12/2002 | Fahimulla | B82Y 10/00 257/192 |
| 2004/0119063 A1 * | 6/2004 | Guo | H01L 21/0254 257/13 |
| 2004/0212045 A1 * | 10/2004 | Tilke | H01L 29/41708 257/586 |
| 2006/0076559 A1 * | 4/2006 | Faure | C30B 25/18 257/49 |
| 2006/0097289 A1 * | 5/2006 | Yoo | H01L 21/26513 257/213 |
| 2006/0261356 A1 | 11/2006 | Iwakami et al. | |
| 2008/0023706 A1 | 1/2008 | Saito et al. | |
| 2010/0187566 A1 * | 7/2010 | Jou | H01L 27/0259 257/137 |
| 2011/0001187 A1 * | 1/2011 | Hebert | H01L 29/0634 257/330 |
| 2011/0017972 A1 * | 1/2011 | O'Keefe | H01L 27/15 257/13 |
| 2013/0234146 A1 * | 9/2013 | Prechtl | H01L 29/7786 257/76 |
| 2015/0206962 A1 * | 7/2015 | Chen | H01L 29/66462 257/76 |
| 2016/0141405 A1 * | 5/2016 | Werner | H01L 29/407 257/76 |
| 2020/0303531 A1 * | 9/2020 | Park | H01L 21/02458 |

* cited by examiner

BREAKDOWN RESISTANT HEMT SUBSTRATE AND DEVICE

TECHNICAL FIELD

The instant application relates to semiconductor devices, and in particular relates to high-electron-mobility field effect transistors with high voltage ratings.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN.

HEMTs are commonly formed from III-V semiconductor materials, such as GaN, GaAs, InGaN, AlGaN, etc. In a GaN/AlGaN based HEMT, a two-dimensional electron gas (2DEG) arises at the interface between the AlGaN barrier layer and the GaN buffer layer. The 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

One technique for forming the III-V semiconductor materials used for HEMTs involves using a silicon wafer as a base substrate for the epitaxial growth of the III-V semiconductor material. Silicon wafers are preferable as a base substrate at least in part because of the abundance and availability of silicon. However, direct epitaxial growth of III-V semiconductor material (e.g., GaN) on silicon is not possible. For this reason, the surface of the silicon wafer is coated with a nucleation layer (e.g., an AlN layer), which is conducive to epitaxial growth of III-V semiconductor material. Furthermore, the lattice mismatch between silicon and GaN can cause strain between the two materials. This strain creates defects in the GaN material and detrimentally impacts device performance. For this reason, a lattice transition layer can be provided on the nucleation layer. The lattice transition layer is a layer of AlGaN, for example, with gradually diminishing aluminum content. Another technique involves periodic repetition of e.g., GaN and AlN layers. A pure GaN buffer layer that is stress free and defect free can be grown on top of a lattice transition layer with either one or both of these configurations.

HEMTs are viewed as an attractive candidate for power transistor applications. A power transistor is a device that is capable of switching substantial voltages and/or currents associated with high power applications. However, some drawbacks associated with HEMT devices include high leakage current and reduced voltage blocking capability in comparison to other device technologies. GaN material in particular is susceptible to band-to-band tunneling mechanisms, which contribute to the leakage current of the device at sufficiently large potentials. Furthermore, in the above described structure that includes a silicon wafer and a nucleation layer, an electron inversion layer arises at the interface between the silicon wafer and the nucleation layer, due to polarization effects. At sufficiently large potentials, the electrons from this inversion layer can tunnel through the potential energy barrier or overcome the potential energy barrier via thermionic mechanisms. A combination of both effects is also possible.

One known technique for improving the voltage blocking capability of III-V HEMT devices is to increase the thickness of the buffer layer. For example, a buffer layer thickness of 5 μm or more can be used to provide a GaN based HEMT device with a voltage rating of 400 V. However, forming GaN layers (e.g., by epitaxial growth) with this thickness is costly, as the epitaxial process is difficult to control. Accordingly, there is a need for improvement.

SUMMARY

A compound semiconductor device structure having a main surface and a rear surface opposite the main surface is disclosed. According to an embodiment, the compound semiconductor device structure includes a silicon substrate including first and second substrate layers. The first substrate layer extends to the rear surface. The second substrate layer extends to a first side of the silicon substrate that is opposite from the rear surface such that the first substrate layer is completely separated from the first side by the second substrate layer. The compound semiconductor device structure further includes a nucleation region formed on the first side of the silicon substrate and including a nitride layer, and a lattice transition layer formed on the nucleation region and including a type III-V semiconductor nitride. The lattice transition layer is configured to alleviate stress arising in the silicon substrate due to lattice mismatch between the silicon substrate and other layers in the compound semiconductor device structure. The second substrate layer is configured to suppress an inversion layer in the silicon substrate arising at an interface between the silicon substrate and the nucleation region.

A semiconductor device formed in a compound semiconductor device structure having a main surface and a rear surface opposite the main surface is disclosed. According to an embodiment, the semiconductor device includes a silicon substrate having first and second substrate layers. The first substrate layer extends to the rear surface. The second substrate layer extends to a first side of the silicon substrate that is opposite from the rear surface such that the first substrate layer is completely separated from the first side by the second substrate layer. The semiconductor device further includes a nucleation region formed on the first side of the silicon substrate and including a nitride layer, and a lattice transition layer formed on the nucleation region and including a type III-V semiconductor nitride. The semiconductor device further includes a type III-V semiconductor nitride region formed on the lattice transition layer. The type III-V semiconductor nitride region includes a high electron mobility semiconductor device. The lattice transition layer is configured to alleviate stress arising in the silicon substrate due to lattice mismatch between the silicon substrate and other layers in the compound semiconductor device structure. The second substrate layer is configured to suppress an inversion layer in the silicon substrate arising at an interface between the silicon substrate and the nucleation region.

A method of forming a semiconductor device in a compound semiconductor device structure having a main surface and a rear surface opposite the main surface is disclosed.

According to an embodiment, the method includes forming a silicon substrate including first and second substrate layers. The first substrate layer extends to the rear surface. The second substrate layer extends to a first side of the silicon substrate that is opposite from the rear surface such that the first substrate layer is completely separated from the first side by the second substrate layer. The method further includes forming a nucleation region on the first side of the silicon substrate, the nucleation region including a nitride layer, and forming a lattice transition layer on the nucleation region. The lattice transition layer is configured to alleviate stress arising in the silicon substrate due to lattice mismatch between the silicon substrate and other layers in the compound semiconductor device structure. The method further includes epitaxially growing a type III-V semiconductor nitride region on the lattice transition layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates a breakdown voltage comparison of two different compound semiconductor device structures, according to an embodiment.

DETAILED DESCRIPTION

Embodiments disclosed herein include a compound semiconductor device structure with features that mitigate electron emission and tunneling mechanisms to increase the vertical breakdown strength of the semiconductor material. One advantageous feature of the compound semiconductor device structure is a highly doped layer that is disposed in silicon substrate portion of the compound semiconductor device. This highly doped layer may be a p-type layer. The remaining portions of the silicon substrate can be n-type, or alternatively may be p-type with a lower doping concentration than the highly doped layer, for example. The highly doped layer lines the interface between the silicon substrate and the nucleation region and depletes the interface region of electrons. Thus, the inversion layer that forms at this interface is deprived of electrons and the source of electrons for injection into the nucleation region is substantially abrogated or at least suppressed. Another advantageous feature of the compound semiconductor device structure is the composition of the nucleation region. According to an embodiment, the nucleation region is a compound semiconductor layer, with a doped type III-V semiconductor nitride (e.g., AlGaN) layer interposed between two nitride (e.g., AlN) layers. The doped type III-V semiconductor nitride layer heightens the energy barrier for carriers that are present in the nucleation region and therefore mitigates tunneling across the nucleation region. Further advantages of the compound semiconductor device structure will become apparent to persons of ordinary skill in view of the following description.

Figure 1:
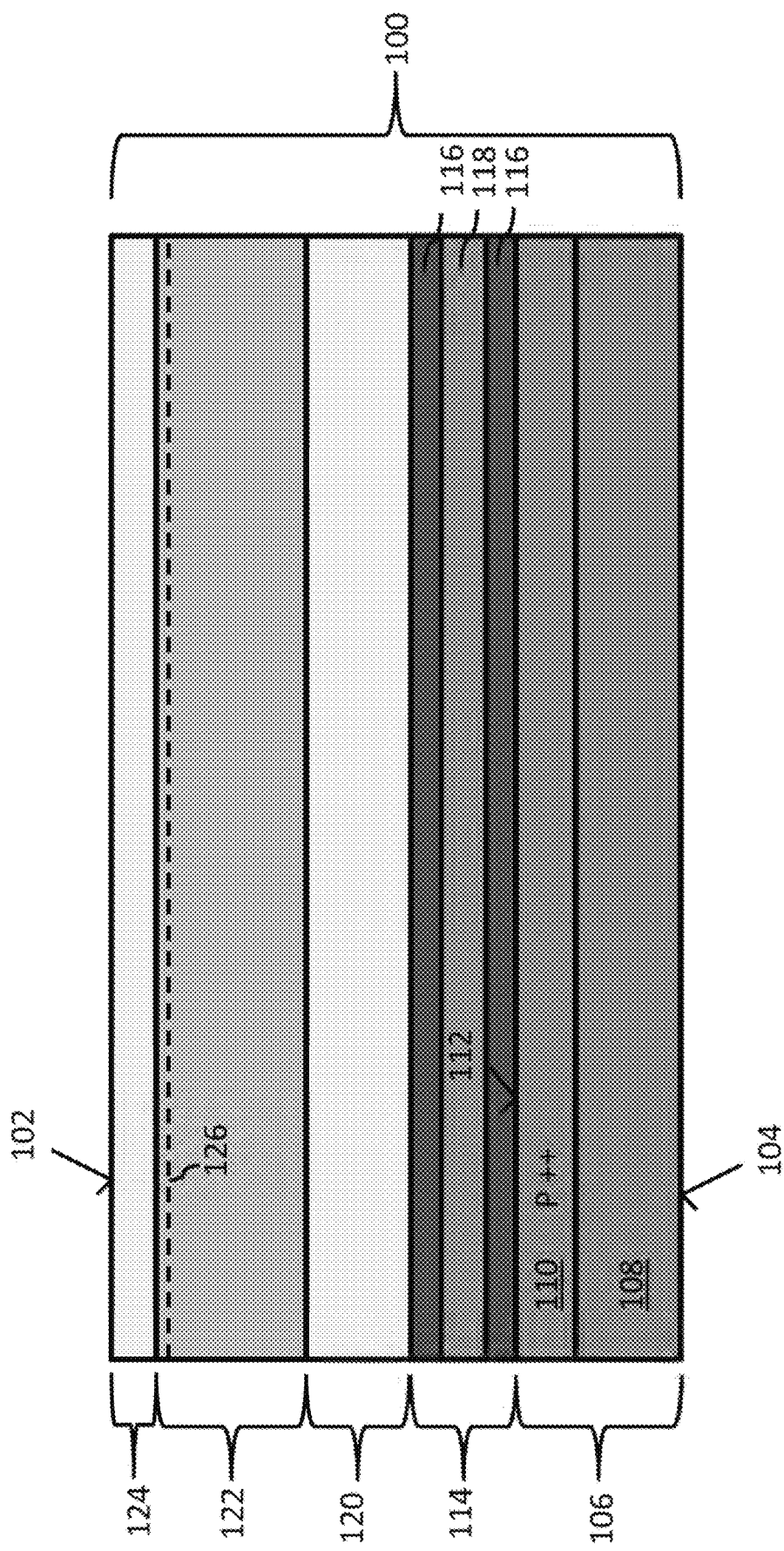
FIG. 1 illustrates a compound semiconductor device structure, according to an embodiment.

Referring to FIG. 1, a compound semiconductor device structure 100 is depicted, according to an embodiment. The compound semiconductor device structure 100 has a main surface 102 and a rear surface 104 that is opposite to opposite the main surface 102. The main and rear surfaces 102, 104 are lateral surfaces, and the compound semiconductor device structure 100 further includes vertical edge sides extending between the main and rear surfaces 102, 104.

The compound semiconductor device structure 100 includes a substrate 106. The substrate 106 can be formed from any semiconductor material suitable for manufacturing semiconductor devices, and in particular any material suitable for the epitaxial growth of a type III-V semiconductor nitride thereon. Exemplary materials for the substrate 106 include silicon (Si), group IV compound semiconductor materials such as silicon carbide (SiC) or silicon germanium (SiGe). According to an embodiment, the substrate 106 is formed from silicon (Si).

The substrate 106 includes first and second substrate layers 108, 110. According to an embodiment, the first substrate layer 108 may has a first conductivity type (e.g., n-type) and the second substrate layer 110 has a second conductivity type (e.g., p-type). That is, the first and second substrate layers 108, 110 are oppositely doped from one another. Alternatively, both the first and second substrate layers 108, 110 may have the second conductivity type, with the first substrate layer 108 having a lower doping concentration than the second substrate layer 110. For example, the first substrate layer 108 may be a "P-type" layer, whereas the second substrate layer 110 may be a "P++-type" layer. The doping concentration refers to the majority carrier concentration of the referenced semiconductor region. For example, the first substrate layer 108 may include some amount of n-type dopants and nonetheless may be a "P-type" layer if all of the n-type dopants are fully compensated for.

The first substrate layer 108 extends to the rear surface 104 of the compound semiconductor device. That is, the first substrate layer 108 is bounded by the lowermost semiconductor surface of the compound semiconductor device structure 100. The second substrate layer 110 extends to a first side 112 of the silicon substrate 106 that is opposite from the rear surface 104. Further, the first substrate layer 108 may be completely separated from the first side 112 by the second substrate layer 110. That is, the second substrate layer 110 completely lines the first side 112 of the substrate 106 such that none of the first conductivity type semiconductor material in the substrate 106 contacts the first side 112 of the substrate 106.

Optionally, the substrate 106 may include additional substrate layers of the first or second conductivity type. Furthermore, the doping profile of any of the layers in the substrate 106 may be non-linear. In general, any number of layers of doping profile of these layers that serves to suppress the accumulation of electrons at or near the first side 112 of the silicon substrate 106 is possible.

According to an embodiment, the substrate 106 is formed by providing a bulk silicon substrate with a first conductivity type. The bulk silicon substrate may have an intrinsic doping of the first or second conductivity type. Alternatively the bulk silicon substrate may be doped (e.g., by implantation or diffusion) to realize a desired doping type and concentration. According to an embodiment, a doping concentration of the bulk substrate is between $10^{14}$ cm$^{-3}$ and $10^{19}$ cm$^{-3}$ Subsequently, second conductivity type dopants may be implanted or diffused into a lateral surface of the first conductivity type bulk substrate so as to form the second substrate layer 110 extending into the substrate 106 from the lateral surface of the bulk substrate. The second substrate layer 110 may be highly doped (e.g., P++) with a doping concentration of at least $10^{19}$ cm$^{-3}$. According to one embodiment, the second substrate layer 110 has a doping concentration of at least $10^{20}$ cm$^{-3}$.

Instead of forming the second substrate layer 110 as a doped region in a bulk substrate 106, the second substrate layer 110 can be formed epitaxially. For example, according to an embodiment, a first or second conductivity type bulk substrate is provided and the second substrate layer 110 is epitaxially grown on the bulk substrate to form the multilayer substrate 106 shown in FIG. 1.

The compound semiconductor device structure 100 further includes a nucleation region 114 formed on the first side 112 of the silicon substrate 106. The nucleation region 114 includes at least one relatively thin (e.g. ≤300 nm) nitride layer 116 that is conducive to the epitaxial growth of type III-V semiconductor nitride (e.g., GaN) thereon. That is, the nucleation region 114 includes a material that ensures robust and defect free growth of the type III-V semiconductor nitride material. The nitride layer 116 is also an electrically insulating layer. According to an embodiment, the nitride layer 116 is an AlN (Aluminum Nitride) layer.

According to an embodiment, the nucleation region 114 is a compound semiconductor layer having multiple semiconductor layers of different composition. For example, the nucleation region 114 may include two or more nitride layers 116. The nitride layers 116 are separated from one another by another by a doped type III-V semiconductor nitride layer 118. According to an embodiment, the nucleation region 114 includes a first nitride layer 116 that is formed on the first side 112 of the silicon substrate 106. The first nitride layer 116 may be formed from AlN. The nucleation region 114 further includes a first doped type III-V semiconductor nitride layer 118 that is formed on the first nitride layer 116. The first doped type III-V semiconductor nitride layer 118 may be formed from AlGaN. The nucleation region 114 further includes a second nitride layer 116 that is formed on the first doped type III-V semiconductor nitride layer 118. The second nitride layer 116 may be formed from AlN. The first and second nitride layers 116 may each have a thickness of 300 nm. The first doped type III-V semiconductor nitride layer 118 may have a thickness of 0.5 μm.

The compound semiconductor device structure 100 further includes a lattice transition layer 120 formed on the nucleation region 114. The lattice transition layer 120 may be formed from a doped type III-V semiconductor nitride material. For example, the lattice transition layer 120 may be an AlGaN layer. The lattice transition layer 120 is configured to alleviate stress arising in the silicon substrate 106 due to lattice mismatch between the silicon material of the substrate 106 and other layers in the compound semiconductor device structure 100, such as any type III-V semiconductor nitride that is formed on the substrate 106. The lattice transition layer 120 gradually distributes the stress that arises between the substrate 106 and the type III-V semiconductor nitride that is grown on the substrate 106 due to the lattice mismatch between the materials. Thus, the top of the lattice transition layer 120 is more suitable for the formation of a substantially stress free and defect free type III-V semiconductor nitride thereon than the top of the nucleation region 114.

According to one embodiment, the metallic content of the lattice transition layer 120 (i.e., Aluminum, in the case of an AlGaN layer) decreases with increasing separation distance from the nucleation region 114. According to another embodiment, the lattice transition layer 120 includes a series of epitaxial layers, with each of these layers having decreasing metallic content as the immediately subjacent layer. According to another embodiment, the lattice transition layer 120 includes multiple nitride layers (e.g., AlN) periodically interposed between multiple type III-V semiconductor layers (e.g. GaN). In general, any structure that gradually distributes stress that arises in the substrate 106 due to lattice mismatch may be utilized for the lattice transition layer 120.

The compound semiconductor device structure 100 further includes a buffer layer 122 and a barrier layer 124. The barrier layer 124 is formed on the lattice transition layer 120 and the buffer layer 122 is formed on the barrier layer 124. The buffer layer 122 is formed from a semiconductor material having a different band gap than the barrier layer 124. A two-dimensional charge carrier gas channel 126 arises along an interface between the buffer layer 122 and the barrier layer 124 due to polarization effects.

In general, III-V semiconductor materials, such as GaN, are used to form high electron mobility semiconductor devices. With GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas such as a 2DEG (two-dimensional electron gas) or 2DHG (two-dimensional hole gas) forms the channel region of the device. A thin, e.g. 1-2 nm, AlN layer can be provided between the GaN buffer layer and the alloy barrier layer to minimize alloy scattering and enhance 2DEG mobility. Other combinations of III-V semiconductor materials can be used in order to form a 2DEG or 2DHG channel region, as is well known in the art. In general, any heterostructure can be used where a band discontinuity is responsible for the device concept. For example with an AlGaAs system there is no piezoelectric effect, but a confinement concept which involves arranging quantum wells for confinement of the channel region is possible.

According to an embodiment, the buffer layer 122 includes GaN and the barrier layer 124 includes AlGaN. The buffer layer 122 can be an intrinsic layer of pure or essentially pure GaN. Alternatively, the buffer layer 122 can be formed by a layer of AlGaN with a very low Al content (e.g. ≤0%). The buffer layer 122 can in addition or in the alternative include other dopant atoms (e.g., carbon or iron). These doping techniques increase the breakdown strength of the compound semiconductor device structure 100 by reducing band-to-band tunneling effects. Both of the buffer and barrier layers 122, 124 can be formed by epitaxial growth techniques, for example.

Figure 2:
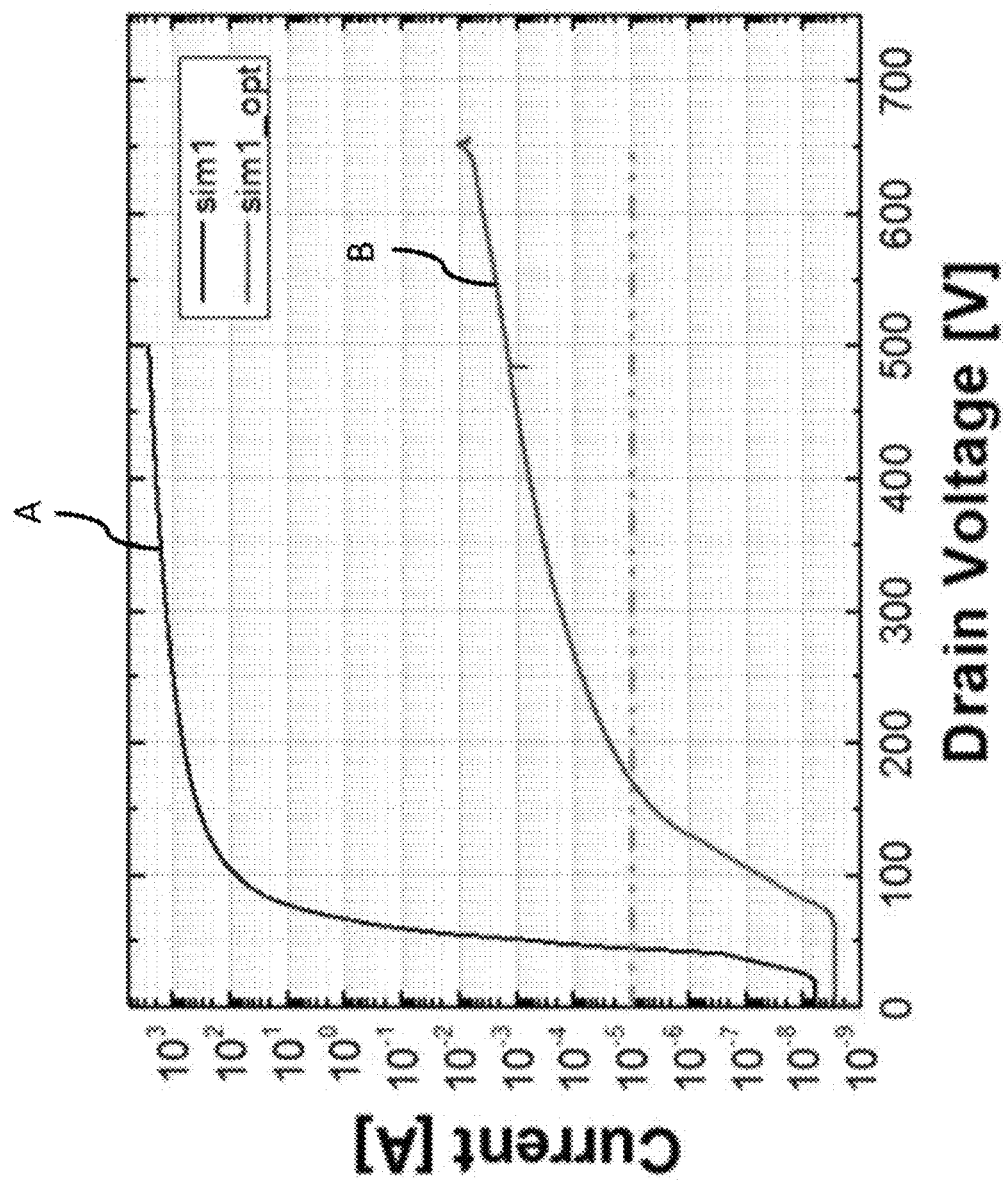
FIG. 2, which includes

FIG. 2 depicts a graph of the vertical breakdown characteristics of two semiconductor device structures. In these simulations, the opposing lateral surfaces of the semiconductor device structures are biased at high voltages, and the vertical conduction of the material is observed. In the context of a transistor that is formed in one of these semiconductor device structures, these simulations indicate the voltages at which a vertical leakage path arises in the device.

Curve A represents an I/V curve of a structure that is substantially similar to the compound semiconductor device structure 100 of FIG. 1, with two exceptions. First, the structure plotted by curve A does not include the second substrate layer 110 in the silicon substrate 106. That is, the substrate 106 directly contacts the nucleation region 114, without a highly doped second conductivity type layer at an interface with the nucleation region 114 that suppresses an inversion layer in this region. Second, the nucleation region 114 of the structure plotted by curve A is not a compound semiconductor layer. That is, the nucleation region 114 includes only a single nitride layer 116 and does not include the doped type III-V semiconductor nitride layer 118. Curve B depicts represents an I/V curve of the compound semiconductor device structure 100 of FIG. 1. Thus, the contribution of the second substrate layer 110 and the compound aspect of the nucleation region 114 to the overall vertical breakdown characteristics of the compound semiconductor device structure 100 can be observed As can be seen in FIG. 2, the structure plotted by curve A is much more susceptible to vertical breakdown than the compound semiconductor device structure 100 plotted by curve B. The structure plotted by curve A begins to breakdown (i.e., become conductive) before the compound semiconductor device structure 100 plotted by curve B. When the electric field in the buffer and barrier layers 122, 124 is sufficiently large, tunneling and runaway effects cause the GaN material to become conductive. Band-to-band tunneling effects and thermionic emission in the nucleation region 114 allow carriers from the nucleation region 114 to enter the buffer and barrier layers 122, 124 of the compound semiconductor device structure 100. The presence of the doped type III-V semiconductor nitride layer 118 in the nucleation region 114 introduces an energy barrier that mitigates this tunneling effect and therefore causes initial conduction to occur at higher values. At even higher voltages, injection of electrons from the substrate 106 into the nucleation region 114 begins to occur. This injection can arise from electron emission or tunneling or other trap related mechanisms. The presence of the second substrate layer 110 deprives the nucleation region 114 of electrons for this injection effect. This is shown in the graphs, as the current in curve B plateaus at lower values than the current in curve A. In fact, the breakdown current curve B is several orders of magnitude lower than in curve B. Thus, the features of compound semiconductor device structure 100 substantially mitigate on-state leakage at high voltages.

Figure 3:
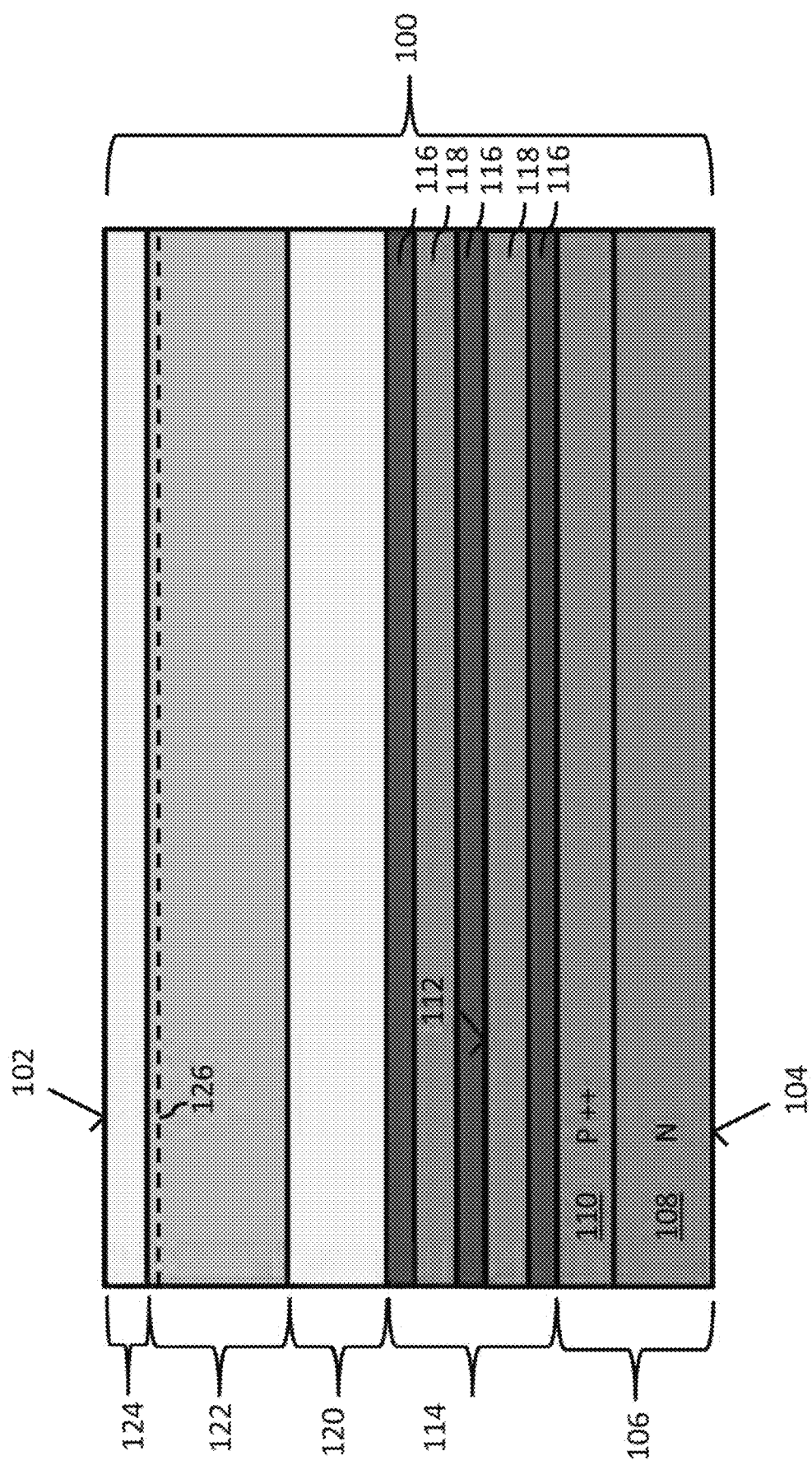
FIG. 3 illustrates a compound semiconductor device structure, according to another embodiment.

Referring to FIG. 3, a compound semiconductor device structure 100 is depicted, according to another embodiment. The compound semiconductor device structure 100 is substantially similar to the compound semiconductor device structure 100 of FIG. 1, except in regards to the structure of the nucleation region 114. More specifically, the nucleation region 114 includes additional layers. According to an embodiment, the nucleation region 114 includes a second doped type III-V semiconductor nitride layer 118 that is formed on the second nitride layer 116. The second doped type III-V semiconductor nitride layer 118 may be formed from AlGaN. The nucleation region 114 further includes a third nitride layer 116 that is formed on the second doped type III-V semiconductor nitride layer 118. The third nitride layer 116 may be formed from AlN. The second doped type III-V semiconductor nitride layer 118 and the third nitride layer 116 may have the same composition and thickness as the first doped type III-V semiconductor nitride layer 118 and the first or second nitride layers 116, respectively. The same concept may extended to configure the nucleation region 114 with three, four, five, etc. nitride layers 116, with each layer being spaced apart from one another by one of the doped type III-V semiconductor nitride layers 118.

Figure 4:
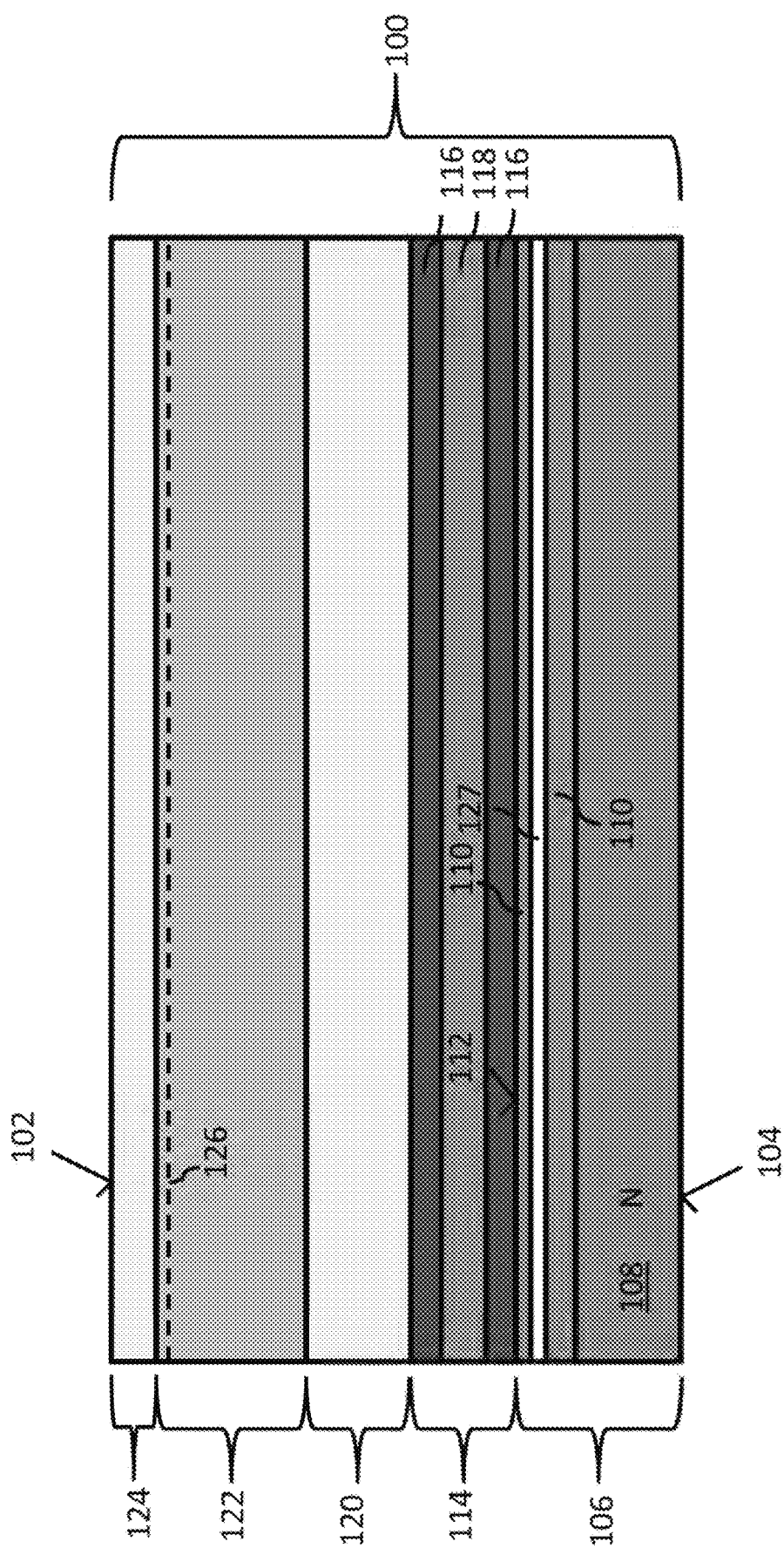
FIG. 4 illustrates a compound semiconductor device structure, according to another embodiment.

Referring to FIG. 4, a compound semiconductor device structure 100 is depicted, according to another embodiment. The compound semiconductor device structure 100 is substantially similar to the compound semiconductor device structure 100 of FIG. 1, except in regards to the configuration of the substrate 106. The compound semiconductor device structure 100 of FIG. 3 includes a buried insulator layer 127 formed in the substrate 106. The buried insulator layer 127 extends parallel to the main and rear surfaces 102, 104. That is, the buried insulator layer 127 laterally extends across the substrate 106, and may reach the vertical edge sides of the substrate 106. The buried insulator layer 127 is spaced apart from the first side 112 of the substrate 106. Thus, the buried insulator layer 127 does not physically contact the nucleation region 114. However, the buried insulator layer 127 is spaced closely to the nucleation region 114. According to an embodiment, a separation distance between the buried insulator layer 127 and the first side 112 of the substrate 106 (upon which the nucleation region 114 is disposed) is in the tens of nanometers, e.g. ≤200 nm. The overall thickness of the buried insulator layer 127 can also be in the tens of nanometers, e.g. ≤200 nm. The buried insulator layer 127 introduces another energy barrier into the silicon substrate 106 that further reduces the amount of available electrons for injection from the substrate 106 into the nucleation region 114.

The buried insulator layer 127 may be an oxide layer, such as $SiO_2$. In this embodiment, the substrate 106 may be formed by a sequence of epitaxial deposition and oxide growth. For example, the buried insulator layer 127 may be deposited on a surface of the substrate 106. Subsequently, a thin layer of second conductivity type silicon may be epitaxially grown on the buried insulator layer 127 to form the second substrate layer 110 that contacts the nucleation region 114. Alternatively, the buried insulator layer 127 could be formed by a high energy implantation step that damages the periodicity of the silicon lattice in the substrate 106 so as to form an amorphous region.

Figure 5:
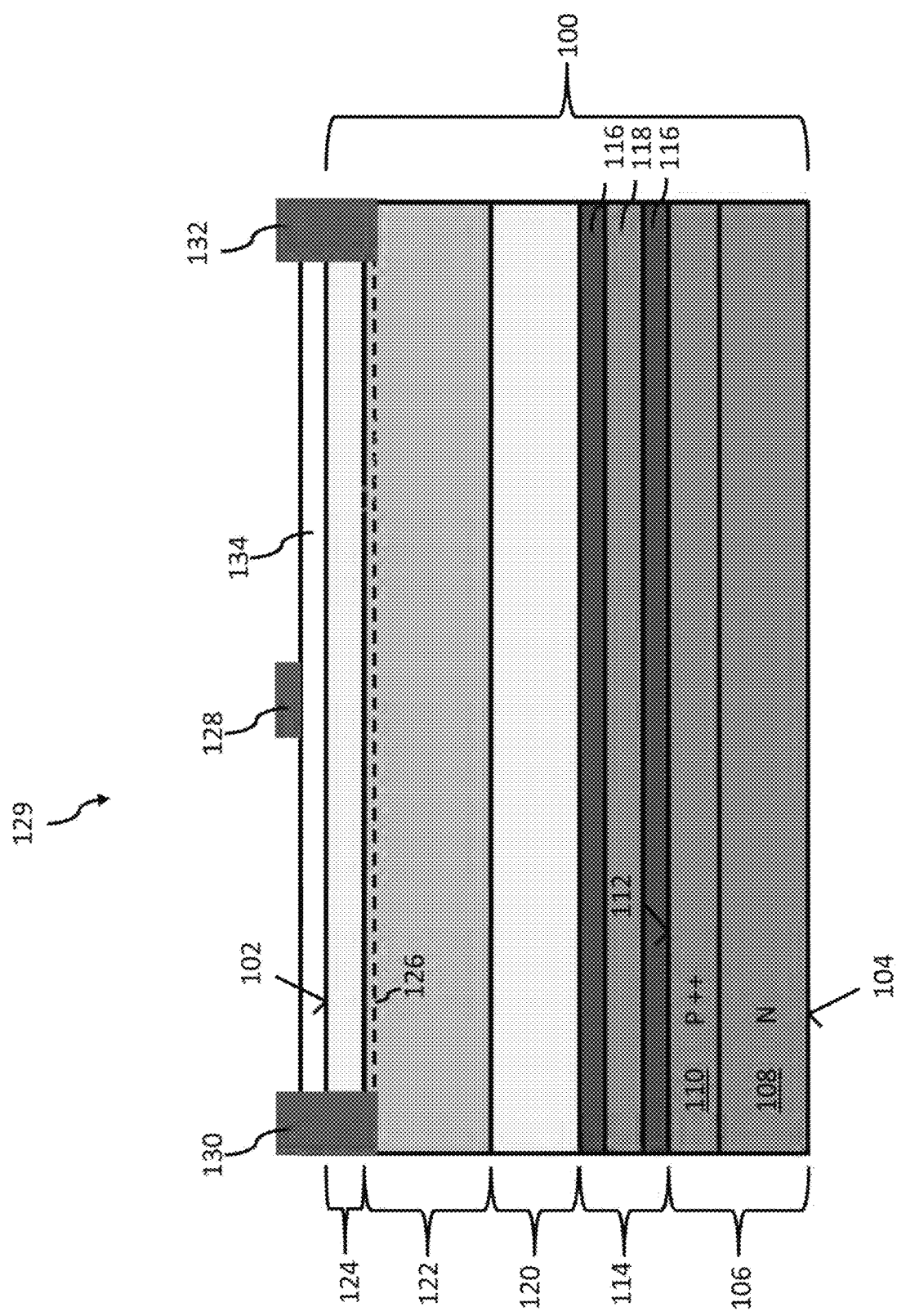
FIG. 5 illustrates a semiconductor device formed in a compound semiconductor device structure, according to an embodiment.

Referring to FIG. 5, semiconductor device that is formed in a compound semiconductor device structure 100 is depicted, according to an embodiment. The compound semiconductor device structure 100 may be substantially similar or identical to the compound semiconductor device structure 100 of FIG. 1. The semiconductor device includes a high electron mobility semiconductor device 129 that is formed in the type III-V semiconductor nitride device region, which is collectively formed from the buffer layer 122 and the barrier layer 124.

The high electron mobility semiconductor device 129 is an HEMT that is configured to control a conduction state of the two-dimensional charge carrier gas channel 126 responsive to a gate bias. The high electron mobility semiconductor device 129 includes an electrically conductive gate electrode 128 that is disposed over the two-dimensional charge carrier gas channel 126 and configured to apply an electric field that depletes the carriers in the two-dimensional charge carrier gas channel 126 and thus provides ON/OFF control. The high electron mobility semiconductor device 129 further includes electrically conductive source and drain electrodes 130, 132 that are both in ohmic contact with the two-dimensional charge carrier gas channel 126. The high electron mobility semiconductor device 129 further includes a passivation layer 134 disposed on the main surface 102. The passivation layer 134 may be formed from any of a variety of electrically insulating materials, such as $SiO_2$ or SiN, that are commonly used to protects and insulate the semiconducting portion of a semiconductor device.

The high electron mobility semiconductor device 129 of FIG. 5 is one example of a variety of potential device configurations that can be formed in the compound semiconductor device structure 100. These devices can include features that alter the intrinsic "normally-on" configuration of the device into a "normally-off" configuration. For example, a doped region (e.g., p-type GaN) may be interposed between the gate electrode 128 and the two-dimensional charge carrier gas channel 126 to deplete the two-dimensional charge carrier gas channel 126 in the absence of a gate bias and thus create a "normally-off" configuration. Alternatively, the gate may be provided in a recessed portion of the barrier layer 124 that disrupts the two-dimensional charge carrier gas channel 126. Further, any number of passivation layers 134 may be provided. The source and drain electrodes 130, 132 may be formed on these passivation layers 134, or may extend through the passivation layers and into the barrier layer 124. The high electron mobility semiconductor device 129 shown in FIG. 5 is configured as a lateral device. That is, the conductive channel portion extends in a lateral direction that is parallel to the main surface 102. Alternatively, the high electron mobility semiconductor device 129 may be configured as a vertical or quasi-vertical device such that at least a portion of the conductive channel extends in a vertical direction that is perpendicular to the main surface 102.

The term "power semiconductor device" as used in this specification intends to describe a semiconductor device on a single chip with high voltage and/or high current switching capabilities. In other words, power semiconductor devices are intended for high current, typically in the range of one or more Amperes and/or high voltages, typically above 100 V, more typically above 400 V.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

The term "in ohmic contact" or "electrically connected" or "in electrical contact" describes a permanent, non-rectifying electrical junction between two conductors that has linear current-voltage (I-V) characteristics, as with Ohm's law. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

The term "lateral" as used in this specification intends to describe an orientation substantially parallel to a first or main surface of a semiconductor substrate or body. This can be for instance the surface of a wafer or a die.

The term "vertical" as used in this specification intends to describe an orientation that is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor device can be formed with opposite doping relations so that the first conductivity type can be p-doped and the second conductivity type can be n-doped. Furthermore, some figures illustrate relative doping concentrations by indicating "−" or "+" next to the doping type. For example, "n" means a doping concentration that is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A compound semiconductor device structure having a main surface and a rear surface opposite the main surface, the compound semiconductor device structure comprising:
a silicon substrate comprising first and second substrate layers, the first substrate layer extending to the rear surface, the second substrate layer extending to a first side of the silicon substrate that is opposite from the rear surface such that the first substrate layer is completely separated from the first side by the second substrate layer;
a nucleation region formed on the first side of the silicon substrate and comprising a nitride layer; and a lattice transition layer formed on the nucleation region and comprising a type III-V semiconductor nitride, wherein the lattice transition layer is configured to alleviate stress arising in the silicon substrate due to lattice mismatch between the silicon substrate and other layers in the compound semiconductor device structure, and wherein the second substrate layer is configured to suppress an inversion layer in the silicon substrate arising at an interface between the silicon substrate and the nucleation region, wherein the nucleation region comprises a first layer of aluminum nitride, a second layer of aluminum nitride, and a first layer of type III-V semiconductor nitride, wherein the first layer of aluminum nitride is in direct contact with the first side of the silicon substrate, and wherein the first layer of type III-V semiconductor nitride is disposed between the first and second layers of aluminum nitride.

2. The compound semiconductor device structure of claim 1, wherein the first substrate layer has an n-type majority carrier concentration and the second substrate layer has a p-type majority carrier concentration.

3. The compound semiconductor device structure of claim 1, wherein the first substrate layer has a p-type majority carrier concentration and the second substrate layer has a p-type majority carrier concentration, and wherein the second substrate layer is more highly doped than the first substrate layer.

4. The compound semiconductor device structure of claim 1, further comprising:
a buffer layer formed on the lattice transition layer, and
a barrier layer formed on the buffer layer and extending to the main surface, the barrier layer having a different band gap than the buffer layer, wherein a two-dimensional charge carrier gas channel arises along an interface between the buffer layer and the barrier layer.

5. The compound semiconductor device structure of claim 4, wherein the buffer layer comprises GaN, and wherein the barrier layer comprises AlGaN.

6. The compound semiconductor device structure of claim 1, wherein the first substrate layer is a layer of p-type or n-type silicon, and wherein the second substrate layer is a layer of highly doped p-type silicon.

7. The compound semiconductor device structure of claim 1, wherein the first layer of type III-V semiconductor nitride is disposed directly on the first layer of aluminum nitride, and wherein the second layer of aluminum nitride is disposed directly on the first layer of type III-V semiconductor nitride.

8. The compound semiconductor device structure of claim 7, wherein the first layer of type III-V semiconductor nitride is a layer of AlGaN.

9. A semiconductor device formed in a compound semiconductor device structure having a main surface and a rear surface opposite the main surface, the semiconductor device comprising:
a silicon substrate comprising first and second substrate layers, the first substrate layer extending to the rear surface, the second substrate layer extending to a first side of the silicon substrate that is opposite from the rear surface such that the first substrate layer is completely separated from the first side by the second substrate layer;
a nucleation region formed on the first side of the silicon substrate and comprising a nitride layer;
a lattice transition layer formed on the nucleation region and comprising a type III-V semiconductor nitride; and
a type III-V semiconductor nitride region formed on the lattice transition layer, the type III-V semiconductor nitride region comprising a high electron mobility semiconductor device,
wherein the lattice transition layer is configured to alleviate stress arising in the silicon substrate due to lattice mismatch between the silicon substrate and other layers in the compound semiconductor device structure,
wherein the second substrate layer is configured to suppress an inversion layer in the silicon substrate arising at an interface between the silicon substrate and the nucleation region,
wherein the nucleation region comprises a first layer of aluminum nitride, a second layer of aluminum nitride, and a first layer of type III-V semiconductor nitride,
wherein the first layer of aluminum nitride is in direct contact with the first side of the silicon substrate, and
wherein the first layer of type III-V semiconductor nitride is disposed between the first and second layers of aluminum nitride.

10. The semiconductor device of claim 9, wherein the type III-V semiconductor nitride region comprises: a buffer layer that formed on the lattice transition layer, and a barrier layer that is formed on the barrier layer, the barrier layer having a different band gap than the buffer layer, wherein a two-dimensional charge carrier gas channel arises along an interface between the buffer layer and the barrier layer, and wherein the high electron mobility semiconductor device is configured to control a conduction state of the two-dimensional charge carrier gas channel.

11. The semiconductor device of claim 9, wherein the first layer of type III-V semiconductor nitride is disposed directly on the first layer of aluminum nitride, and wherein the second layer of aluminum nitride is disposed directly on the first layer of type III-V semiconductor nitride.

12. The semiconductor device of claim 11, wherein the first layer of type III-V semiconductor nitride is a layer of AlGaN.

* * * * *